US010103032B2

(12) United States Patent
deVilliers

(10) Patent No.: US 10,103,032 B2
(45) Date of Patent: *Oct. 16, 2018

(54) METHODS OF FORMING ETCH MASKS FOR SUB-RESOLUTION SUBSTRATE PATTERNING

(71) Applicant: Tokyo Electron Limited, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/271,876

(22) Filed: Sep. 21, 2016

(65) Prior Publication Data

US 2017/0148637 A1    May 25, 2017

Related U.S. Application Data

(60) Provisional application No. 62/258,119, filed on Nov. 20, 2015.

(51) Int. Cl.
*H01L 21/308* (2006.01)
*H01L 21/311* (2006.01)
*H01L 21/033* (2006.01)

(52) U.S. Cl.
CPC ...... *H01L 21/3081* (2013.01); *H01L 21/0337* (2013.01); *H01L 21/3086* (2013.01); *H01L 21/31144* (2013.01)

(58) Field of Classification Search
CPC ............. H01L 21/0337; H01L 21/3081; H01L 21/31144; H01L 21/3086; H01L 21/76816;

(Continued)

(56) References Cited

U.S. PATENT DOCUMENTS 5,667,940 A    9/1997 Hsue et al.
7,767,099 B2   8/2010 Li et al.
(Continued)

FOREIGN PATENT DOCUMENTS

JP    2000-56469 A    2/2000
KR    10-2014-0016663 A    2/2014
(Continued)

OTHER PUBLICATIONS

International Search Report dated Jan. 3, 2017, in PCT/US2016/052879, filed Sep. 21, 2016.
(Continued)

*Primary Examiner* — Caleen Sullivan
(74) *Attorney, Agent, or Firm* — Oblon, McClelland, Maier & Neustadt, L.L.P.

(57) ABSTRACT

Techniques disclosed herein provide a method and fabrication structure for pitch reduction for creating high-resolution features and also for cutting on pitch of sub-resolution features. Techniques include using multiple materials having different etch characteristics to selectively etch features and create cuts or blocks where specified. A hardmask is positioned first on an underlying layer or layers to be etched. A pattern of alternating materials is formed on the hardmask. One or more of the alternating materials can be preferentially removed relative to other materials to uncover a portion of the hardmask layer. The hardmask and the remaining lines of alternating material together form a combined etch mask defining sub-resolution features.

19 Claims, 7 Drawing Sheets

(58) Field of Classification Search
CPC ............. H01L 21/0338; H01L 21/0332; H01L 21/32139; H01L 21/0271; H01L 21/308; H01L 21/76877; G03F 7/0002; G03F 7/038; G03F 7/165; G03F 7/0035; B82Y 10/00; B82Y 40/00; C08L 53/00; C08L 53/005; C08G 2261/126; B81C 1/00031; B81C 2201/0149; B81C 2201/0198; C09D 153/00
USPC .......................................................... 438/703
See application file for complete search history.

(56) References Cited

U.S. PATENT DOCUMENTS

| | | | |
|---|---|---|---|
| 7,923,373 | B2 | 4/2011 | Sandhu |
| 9,249,013 | B2 | 2/2016 | Wang et al. |
| 2007/0099431 | A1 | 5/2007 | Li |
| 2009/0179194 | A1* | 7/2009 | Wu .................. H01L 21/02126 257/40 |
| 2014/0024191 | A1 | 1/2014 | Chen et al. |
| 2014/0072830 | A1* | 3/2014 | Lille .................... G11B 5/855 428/847 |
| 2014/0091476 | A1* | 4/2014 | Nyhus ................ H01L 23/5226 257/774 |
| 2014/0273476 | A1* | 9/2014 | Cheng ................ B81C 1/00031 438/703 |
| 2015/0243518 | A1 | 8/2015 | Devilliers |
| 2015/0311075 | A1 | 10/2015 | Huang et al. |

FOREIGN PATENT DOCUMENTS

| | | |
|---|---|---|
| TW | 200845235 A | 11/2008 |
| TW | 200908091 | 2/2009 |
| TW | 201407265 A | 2/2014 |

OTHER PUBLICATIONS

Combined Office Action and Search Report dated Jun. 16, 2017, in Taiwanese Patent Application No. 105137354 (with English-language translation).

* cited by examiner

METHODS OF FORMING ETCH MASKS FOR SUB-RESOLUTION SUBSTRATE PATTERNING

CROSS REFERENCE TO RELATED APPLICATIONS

The present application claims the benefit of U.S. Provisional Patent Application No. 62/258,119, filed on Nov. 20, 2015, entitled "Methods of Forming Etch Masks for Sub-Resolution Substrate Patterning," which is incorporated herein by reference in its entirety.

BACKGROUND OF THE INVENTION

This disclosure relates to substrate processing, and, more particularly, to techniques for patterning substrates including patterning semiconductor wafers.

Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a relief pattern which can be used as an etch mask to transfer a pattern into an underlying layer on a substrate. Patterning of the radiation-sensitive material generally involves exposure to actinic radiation through a reticle (and associated optics) onto the radiation-sensitive material using, for example, a photo-lithography system. This exposure can then be followed by the removal of irradiated regions of the radiation-sensitive material (as in the case of positive photoresist), or non-irradiated regions (as in the case of negative resist) using a developing solvent. This mask layer can comprise multiple sub-layers.

Conventional lithographic techniques for exposing a pattern of radiation or light onto a substrate have various challenges that limit a size of features exposed, and limit pitch or spacing between exposed features. One conventional technique to mitigate exposure limitations is that of using a double patterning approach to allow the patterning of smaller features at a smaller pitch than what is currently possible with conventional lithographic techniques.

SUMMARY

Semiconductor technologies are continually progressing to smaller feature sizes or nodes including feature sizes of 14 nanometers, 7 nm, 5 nm, and below. This continual reduction in sizes of features from which various elements are fabricated places ever-greater demands on techniques used to form the features. The concept of "pitch" can be used to describe the sizing of these features. Pitch is the distance between two identical points in two adjacent repetitive features. Half-pitch then is half the distance between identical features of adjacent features.

Pitch reduction techniques are termed (often somewhat erroneously yet routinely) "pitch multiplication" as exemplified by "pitch doubling" et cetera. Pitch reduction techniques can extend the capabilities of photolithography beyond feature size limitations (optical resolution limitations). That is, conventional multiplication of pitch (more accurately pitch reduction, or multiplication of pitch density) by a certain factor involves reducing a target pitch by a specified factor. Double patterning techniques used with 193 nm immersion lithography are conventionally considered as one of the most promising techniques to pattern 22 nm nodes and smaller. Noteworthy is that self-aligned spacer double patterning (SADP) has already been established as a pitch density doubling process and has been adapted in high volume manufacturing of NAND flash memory devices. Moreover, ultra-fine resolution can be obtained to repeat the SADP step twice as pitch quadrupling.

Although there exist several patterning techniques to increase pattern density or pitch density, conventional patterning techniques suffer from poor resolution or rough surfaces of etched features. Thus, conventional techniques cannot provide a level of uniformity and fidelity desired for very small dimensions (20 nm and smaller). Reliable lithographic techniques can produce features having a pitch of about 80 nm. Conventional and emerging design specifications, however, desire to fabricate features having critical dimensions less than about 20 nm or 10 nm. Moreover, with pitch density doubling and quadrupling techniques, sub-resolution lines can be created, but making cuts or connections between these lines is challenging, especially since the pitch and dimensions needed for such cuts is far below capabilities of conventional photo-lithography systems.

Techniques disclosed herein provide a method for pitch reduction (increasing pitch/feature density) for creating high-resolution features and also for cutting on pitch of sub-resolution features. Techniques herein include forming a hardmask first, and then positioning multiple materials having different etch characteristics on the hardmask to selectively etch features and create cuts and blocks where desired. The multiple materials can be a pattern of alternating, sub-resolution lines, and each line can be preferentially etched relative to the other lines. One or more etched lines, combined with the underlying hardmask, provide a combined etch mask defining sub-resolution features. Thus, methods herein provide a sequence of materials that provide selective self-alignment, such as for blocking or cutting. Combined with an underlying transfer layer or memorization layer, many different etch selectivities can be accessed.

One embodiment includes a method of patterning a substrate. A patterned hardmask layer is formed on a substrate. The patterned hardmask layer includes hardmask material that masks a portion of an underlying layer. The patterned hardmask layer includes a fill material that fills a remaining portion of the underlying layer. The fill material has a different etch resistivity relative to the hardmask material. A multi-line layer is formed above the patterned hardmask layer, the multi-line layer includes a region having a pattern of alternating lines of two or more differing materials. Each line has a horizontal thickness, a vertical height, and extends across the patterned hardmask layer. Each line of the pattern of alternating lines is uncovered on a top surface of the multi-line layer and vertically extends to a bottom surface of the multi-line layer. At least two of the two or more differing materials differ chemically from each other by having different etch resistivities relative to each other. At least one of the two or more differing materials are selectively removed resulting in a portion of the patterned hardmask layer being uncovered.

Of course, the order of discussion of the different steps as described herein has been presented for clarity sake. In general, these steps can be performed in any suitable order.

Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1A:
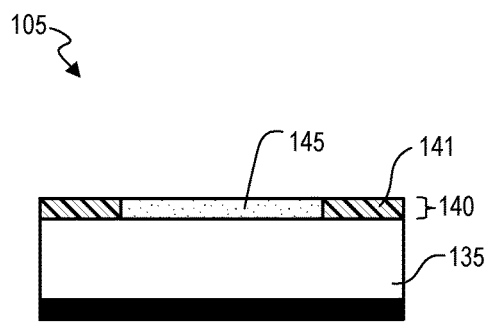
FIGS. 1A, 1B, and 1C are cross-sectional side views of an example substrate segment according to embodiments disclosed herein.
Figure 2A:
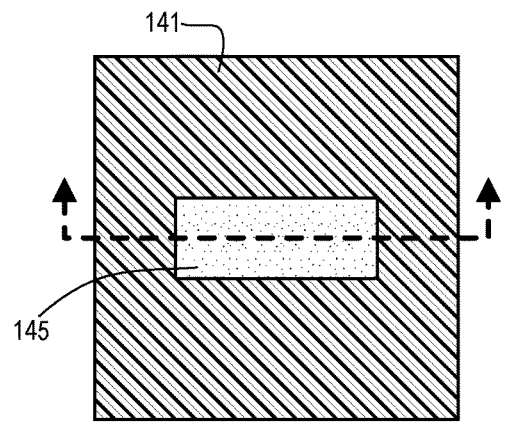
FIGS. 2A and 2B are top views of an example substrate segment according to embodiments disclosed herein.

Techniques disclosed herein, provide a method and fabrication structure for pitch reduction (increasing pitch/feature density) for creating high-resolution features and also for cutting on pitch of sub-resolution features. Techniques include using multiple materials having different etch characteristics to selectively etch features and create cuts or blocks where specified. A hardmask is positioned first on an underlying layer or layers to be etched. Then a pattern of alternating materials is formed on the hardmask. One or more of the alternating materials can be preferentially removed relative to other materials to uncover a portion of the hardmask. The hardmask and the remaining lines of alternating material then form a combined etch mask defining sub-resolution features. Various patterns of materials can be formed on the hardmask, and patterns can include two, three, four, five, or more different materials. Patterns can include having half pitches below 40 nanometers and even below 12 nanometers and smaller. Critical dimensions of materials can be controlled by type of deposition (such as with atomic layer deposition) instead of relying only on optical resolution of lithography systems.

One embodiment includes a method of patterning a substrate. Such a method is useful for microfabrication of semiconductor devices and integrated circuits. Referring now to FIGS. 1A, 1B, 1C, 2A, and 2B, the method includes forming a patterned hardmask layer 140 on a substrate 105. The patterned hardmask layer includes hardmask material 141 that masks a portion of an underlying layer 135. Note that any conventional hardmask material and pattern forming process can be used to form patterned hardmask layer 140. For example, patterned hardmask layer 140 can be lithographically patterned, or can be the result of a given pitch multiplication process. The hardmask material 141 can include inorganic materials as well as metal-containing materials, organometallic, etc. The patterned hardmask layer 140 can include a fill material that fills a remaining portion of the underlying layer. The fill material has a different etch resistivity relative to the hardmask material. In one example, a hardmask layer material is deposited on underlying layer 135, such as by spin-on deposition, chemical vapor deposition, etc. The hardmask material is then patterned and etched to remove a portion of the hardmask material, thereby resulting in a relief pattern of hardmask material on substrate 105.

Figure 1B:
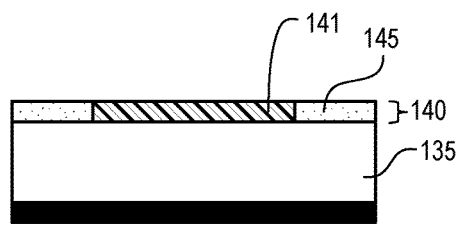
Figure 2B:
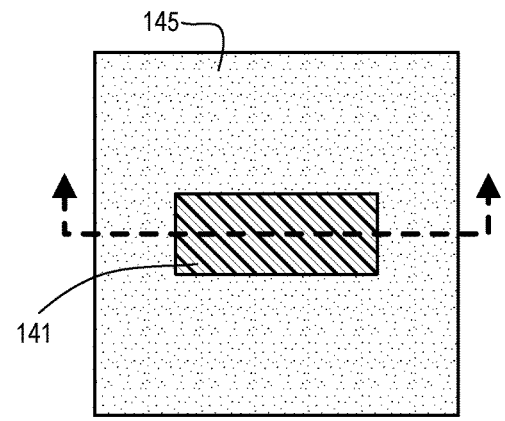
Figure 1C:
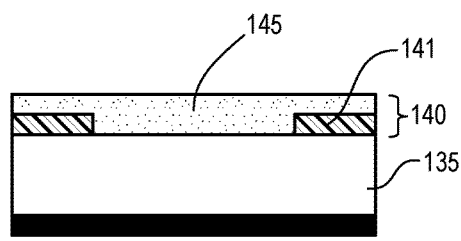

A given hardmask material can be deposited as a relatively thin layer. By way of a non-limiting example, such as layer can be as thin as 10 nanometers or less, though thicker hardmask layers can also be created. With such a thin layer, subsequent overlying layers can be deposited directly thereon. In some embodiments, however, it is advantageous to nevertheless planarize the hardmask layer (planarize a relief pattern of hardmask material) prior to additional material deposition. Any number of different materials can be deposited (such as by spin-on deposition) to planarize the substrate by filling openings defined by the hardmask material 141. In other words, a relief pattern of hardmask material is planarized with fill material. Note that in FIG. 2A, fill material 145 fills an opening defined by hardmask material 141. FIG. 1A is a side cross-sectional view through a center portion of FIG. 2A. Corresponding FIGS. 1B and 2B show a different pattern/configuration of patterned hardmask layer 140 in which hardmask material 141 is a mesa defining an opening, that is, the area surrounding the mesa is the opening. Both types of relief patterns are shown in the drawings to illustrate different resulting patterns that come from different arrangement of materials, as will be apparent below.

In some embodiments, the patterned hardmask layer 140 can include multiple individual hardmask layers including separately patterned layers. For example, a few litho-etch operations can be executed during hardmask layer formation. Thus, the hardmask layer itself can include multiple hardmask patterns or films, or can be created as a result of decomposition pattern forming techniques.

A multi-line layer is formed above the patterned hardmask layer 140. The multi-line layer can be formed directly on the patterned hardmask layer, or on any intervening layer or interfacial films or planarization layers, such as on an anti-reflective coating (ARC) layer. The multi-line layer includes a region having a pattern of alternating lines of two or more differing materials. In some embodiments the alternating lines can cover essentially an entire surface of a substrate, but in other alternative embodiments only particular regions have the pattern of alternating lines. Each line has a horizontal thickness, a vertical height, and extends across the patterned hardmask layer. Note that the alternating lines can include straight lines, curved lines, race track path, et cetera. Another example of alternating lines is a set of concentric circles with each ring being a curved line. Each line of the pattern of alternating lines is uncovered on a top surface of the multi-line layer and vertically extends to a bottom surface of the multi-line layer thereby uncovering the patterned hardmask. In other words, each line of a particular material can be anisotropically etched to a bottom surface of the multi-line layer because lines of material alternate horizontally across a substrate surface in contrast to a vertical stack of materials. At least two of the two or more differing materials differ chemically from each other by having different etch resistivities relative to each other.

Having different etch resistivities from each other, as used herein, means that there is at least one etchant (or etchant combination) that etches a given one material at a greater rate than the other material(s). Note that there can exist particular etchants that etch two or more given materials at a same rate, but there is at least one etchant that etches an included material faster relative to the other material(s). Etching one material relative to another can include etching one material without substantially etching the other, or etching one material at a substantially greater rate as compared to the other material such as having an etch rate ratio of 3:1, 4:1, 10:1, etc. For two materials to have different etch resistivities this typically means that two materials are chemically different from each other such as by particular atomic elements included or arrangement of atomic elements. Two materials that are largely the same, except that one of the two materials includes a dopant, can nevertheless have different etch resistivities. Moreover, materials having the same atomic elements but with differing molecular or crystal structures can provide an etch resistivity differential also.

Figure 3A:
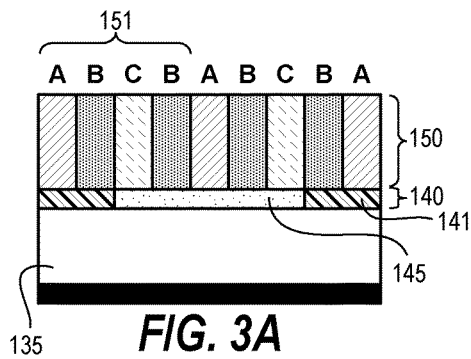
FIGS. 3A, 3B, 3C, 3D and 3E are cross-sectional side views of an example substrate segment according to embodiments disclosed herein.
Figure 4A:
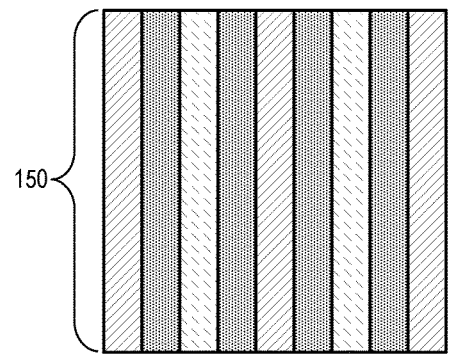
FIGS. 4A and 4B are top views of an example substrate segment according to embodiments disclosed herein.
Figure 3B:
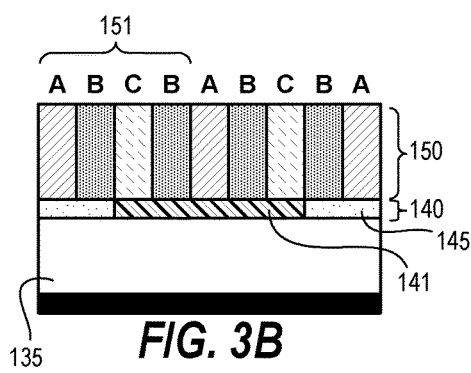
Figure 4B:
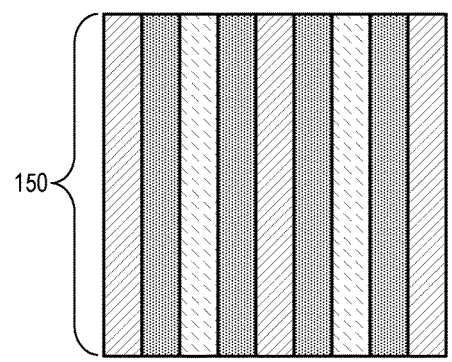
Figure 3C:
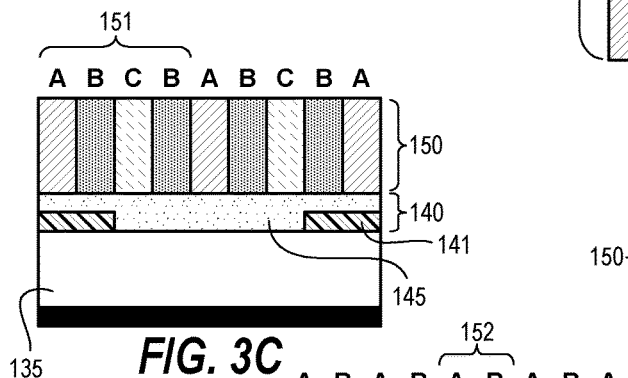
Figure 3E:
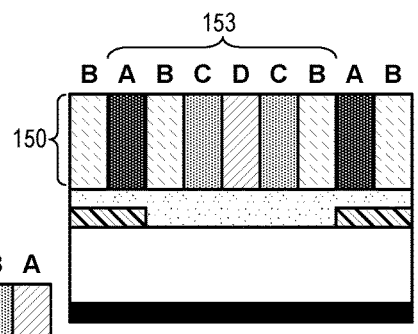
Figure 3D:
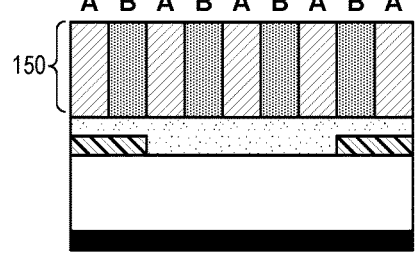

FIGS. 3A-3E, 4A, and 4B illustrate example results of forming a particular multi-line layer. For example, FIGS. 3A shows a side cross-sectional substrate segment having three lines of material formed thereon. The different materials are labeled A, B, and C. Note that bracket 151 shows a particular pattern segment of alternating lines. This pattern follows a sequence of A-B-C-B, which is then repeated. Thus, this pattern can continue with the sequence of A-B-C-B-A-B-C-B-A-B-C-B-A and so on. Note that in this particular multi-line layer material A can be isolated from being in contact with material C by having lines of material B on both sides of material A. In other embodiments, the half pitch of a given material can be varied so that material C can be absent in some regions or larger in other regions. FIG. 4A shows a top view of this substrate segment. Note that from a top view the patterned hardmask layer 140 is covered, but each different material from the multi-line layer 150 is exposed or accessible (uncovered). FIGS. 3B and 4B are similar to FIGS. 3A and 4A, but with a different configuration of patterned hardmask layer 140. FIG. 3C has the same pattern for multi-line layer 150, but shows patterned hardmask layer 140 having a planarizing fill with some overburden. FIG. 3D shows multi-line layer 150 having a different pattern of alternating lines in that there are just two materials (A and B) that alternate with each other as shown by bracket 152. FIG. 3E shows multi-line layer 150 having a different pattern of alternating lines with four materials. Bracket 153 marks a segment of this example pattern that can be repeated. For example, an alternating pattern of repeating lines can having sequence of A-B-C-D-C-B-A-B-C-D-C-B-A, which can continue as is or have some areas with pitch variation. With any of these multi-line layers of patterns of alternating lines of two or more lines of different materials, the underlying hardmask layer can be essentially modified during pattern transfer (either adding to the hardmask material or subtracting from the hardmask material as an aggregate etch mask) as will be subsequently described.

Figure 5A:
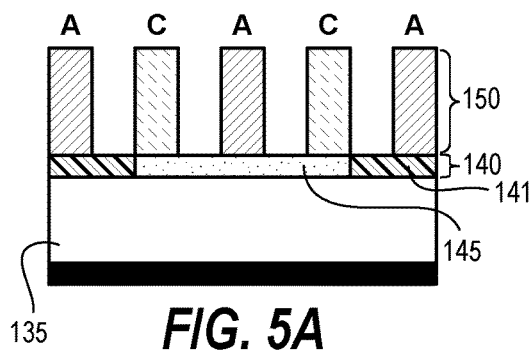
FIGS. 5A and 5B are cross-sectional side views of an example substrate segment according to embodiments disclosed herein.
Figure 6A:
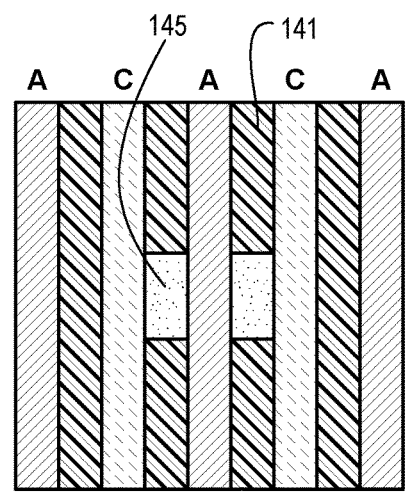
FIGS. 6A and 6B are top views of an example substrate segment according to embodiments disclosed herein.

After forming the multi-line layer, at least one of the two or more differing materials can be selectively removed resulting in a portion of the patterned hardmask layer being uncovered. Selective removal can be executed by any of various material removal processes such as wet etching, dry (plasma) etching, ashing, etc. FIG. 5A shows an example of such selective removal. In FIG. 5A, material B has been removed, such as by directional etching. Materials C and A remain as part of the patterned hardmask layer 140. In FIG. 6A, from a top view, portions of the patterned hardmask layer are uncovered. With material B removed, FIG. 6A illustrates hardmask material 141 and fill material 145 as visible or uncovered. Note that in FIG. 6A, the opening in patterned hardmask layer (where there is only fill material) is narrowed or restricted by lines of materials A and C, leaving two relatively smaller openings when the multi-line layer 150 is combined with the patterned hardmask layer 140 to form a combined etch mask.

Figure 5B:
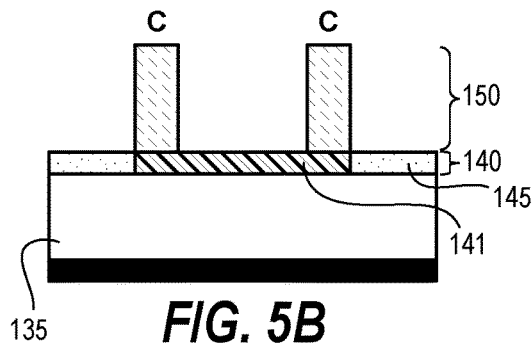
Figure 6B:
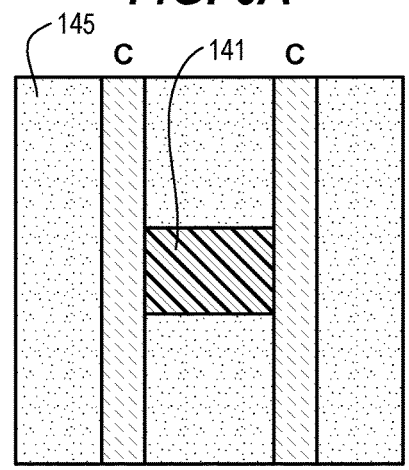
Figure 7A:
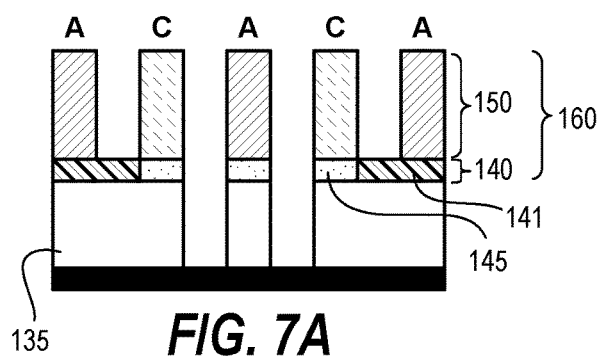
FIGS. 7A and 7B are cross-sectional side views of an example substrate segment according to embodiments disclosed herein.
Figure 8A:
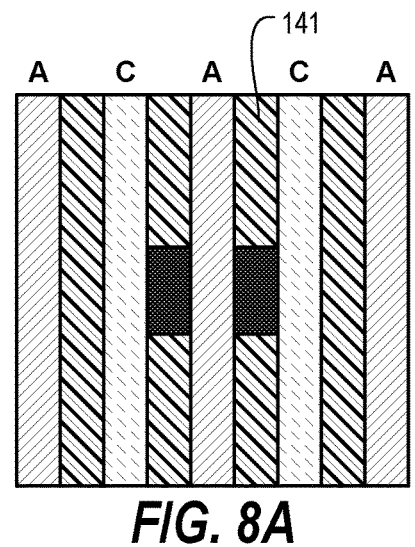
FIGS. 8A and 8B are top views of an example substrate segment according to embodiments disclosed herein.
Figure 7B:
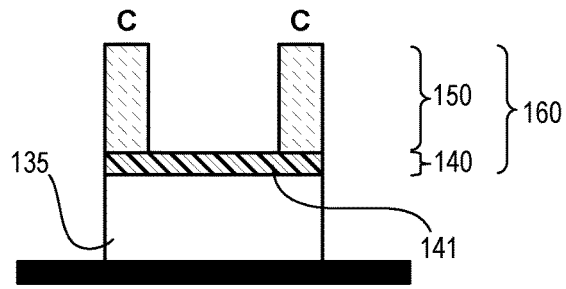
Figure 8B:
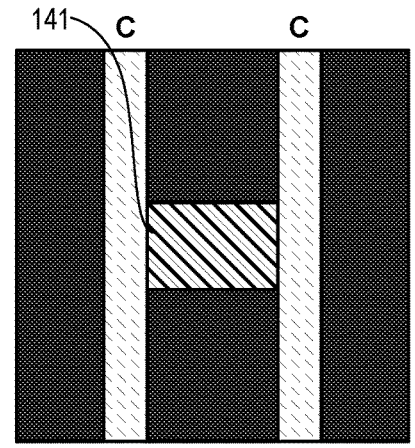

FIGS. 5B and 6B show a different example. In FIG. 5B, materials A and B have been removed, such as by directional etching. In some embodiments, materials A and B can be removed one after the other, such as by using different etch chemistries. In other embodiments, materials A and B can be removed simultaneously while leaving lines of material A. Lines of materials herein can be removed simultaneously with etchants (process gas mixture) configured to etch two materials at a same rate. In some embodiments, the two materials being removed can have a same chemical composition to facilitate simultaneous removal. Note that in FIGS. 5B and 6B, with only material C remaining, material C adds to the hardmask material 141 and this combined pattern essentially forms an etch mask with an "H" shape in this particular substrate segment example. As can be appreciated, there are multiple different options for adding or removing materials to form combined etch masks with an underlying patterned hardmask layer and overlying lines of material.

For example, in other embodiments, the two or more differing materials include three or more differing materials. Selectively removing at least one of the two or more differing materials can then include selectively removing two of the three or more differing materials resulting in corresponding portions of the patterned hardmask layer being uncovered. In another embodiment, the two or more differing materials include four or more differing materials. Selectively removing at least one of the two or more differing materials then includes selectively removing two of the four or more differing materials resulting in corresponding portions of the patterned hardmask layer being uncovered.

In some embodiments, the pattern of alternating lines of two or more differing materials includes a repeating sequence of A-B-A-B in which material A and material B have different etch resistivities relative to each other. In other embodiments, the pattern of alternating lines of two or more differing materials includes a repeating sequence of A-B-C-B-A-B-C-B in which material A and material B have different etch resistivities relative to each other. For example, material C can have a different etch resistivity relative to material A and material B. In another embodiment, the pattern of alternating lines of two or more differing materials includes a repeating sequence of A-B-C-D-C-B-A-B-C-D-C-B, wherein at least two of materials A, B, C and D have different etch resistivities relative to each other.

Various different fabrication techniques can be used to form the multi-line layer. For example, a substrate can be provided having mandrels positioned on the hardmask layer with the mandrels comprised of a first material. First sidewall spacers are then formed on exposed sidewalls of mandrels. The first sidewall spacers are comprised of a second material. Second sidewall spacers are formed on exposed sidewalls of the first sidewall spacers. The second sidewall spacers are comprised of a third material. Fill structures are then formed that fill open spaces defined between exposed sidewalls of second sidewall spacers that face each other. The fill structures are comprised of a fourth material. Top surfaces of the mandrels, the first sidewall spacers, the second sidewall spacers, and the fill structures are all uncovered (exposed). At least two materials of the first material, the second material, the third material and the fourth material are chemically different from each other.

In another embodiment, a substrate can be provided having mandrels positioned on the hardmask layer with the mandrels comprised of a first material. First sidewall spacers are then formed on exposed sidewalls of mandrels. The first sidewall spacers are comprised of a second material. Fill structures are then formed that fill open spaces defined between exposed sidewalls of first sidewall spacers that face each other. The fill structures are comprised of a fourth material. Top surfaces of the mandrels, the first sidewall spacers, and the fill structures are all uncovered (exposed). At least two materials of the first material, the second material, and the fourth material are chemically different from each other.

In another embodiment, a substrate can be provided having mandrels positioned on the hardmask layer with the mandrels comprised of a first material. Fill structures are then formed that fill open spaces defined between exposed sidewalls of the mandrels. The fill structures are comprised of a fourth material. Top surfaces of the mandrels and the fill structures are all uncovered (exposed). At least two materials of the first material and the fourth material are chemically different from each other. An alternative method for forming two or three lines of alternating material is to execute a directed self-assembly operation of block copolymers to form alternating lines of differing material. Many other techniques can be used for forming all or a portion of the multi-line layer including extreme ultraviolet lithography, direct write print pattern, self-aligned quad patterning, self-aligned double patterning, and so forth.

Referring now to FIGS. 7A, 8A, 7B, and 8B, techniques herein can include transferring a combined pattern 160 into the underlying layer 135. The combined pattern 160 is defined by hardmask material and remaining materials of the multi-line layer. In some embodiments, the fill material can have a different etch resistivity as compared to other materials in the multi-line layer and can thus provide another etch selectivity option for controlling pattern transfer. In this example, the fill material that is uncovered is etched away and each combined pattern is transferred into underlying layer 135. In some embodiments, the underlying layer can be a memorization layer that receives the combined pattern during transfer of the combined pattern. This memorization layer can be comprised of material having a different etch resistivity relative to materials in the multi-line layer. With such a configuration, a given combined pattern can be transferred into the memorization layer, then a currently existing line in the multi-line layer can be removed, and a combined pattern transfer can be executed again.

Figure 9A:
FIGS. 9A and 9B are cross-sectional side views of an example substrate segment according to embodiments disclosed herein.
Figure 10A:
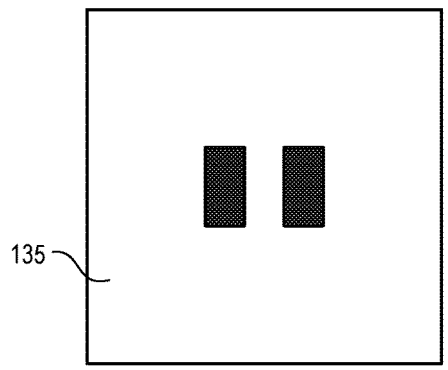
FIGS. 10A and 10B are top views of an example substrate segment according to embodiments disclosed herein.
Figure 9B:
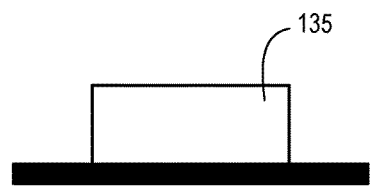
Figure 10B:
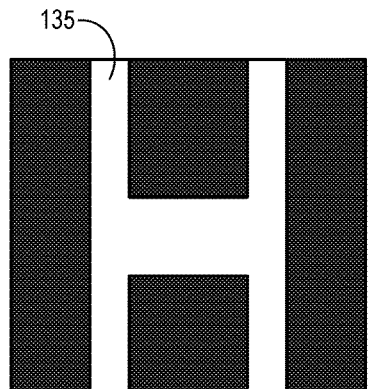

FIGS. 9A, 10A, 9B, and 10B show example patterned substrate segments after combined pattern transfer into underlying layer 135 and after having removed the patterned hardmask layer and multi-line layer. As with previous drawings, FIG. 9A is a cross-sectional side view that corresponds to top view 10A, while FIG. 9B is a cross-sectional side view that corresponds to top view 10B.

In other embodiments, transferring the combined pattern into the underlying layer can include cutting one or more buried structures within the underlying layer. The underlying layer can have buried fin structures or other features that can be cut or added to with the combined pattern transfer. As can be a appreciated, a pitch of a given line of material in the two or more lines can be less than an optical resolution of a given photolithography system. This can be realized because mandrels can be formed by double or multiple patterning reduction techniques, and then additional materials can be deposited by atomic layer deposition or other highly controllable deposition techniques. Lines of material formed this way can have a half-pitch spacing that is less than 16 nanometers.

Figure 11:
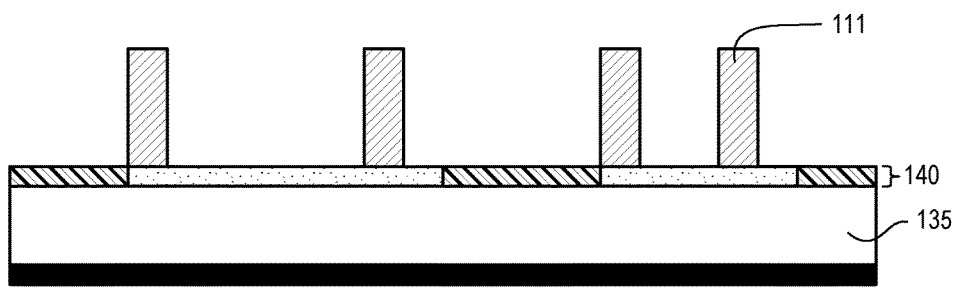
FIGS. 11-17 are cross-sectional side views of an example substrate segment according to embodiments disclosed herein.

FIGS. 11-17 provide more detail on one example technique for forming a particular multi-line layer. In these figures, a multi-line layer of four different materials is being formed. In FIG. 11, a substrate is provided having mandrels 111 positioned on patterned hardmask layer 140, which is in turn positioned on an underlying layer 135. The mandrels 111 are comprised of a first material. The substrate can include a silicon wafer. One or more additional underlying layers and/or buried structures can be included depending on a fabrication step of a given substrate within a given fabrication flow. There are many different materials from which the mandrels can be constructed. Materials can include various nitrides, oxides, organics, metals, as well as other conventionally available materials. Mandrels 111 can be formed using conventional patterning techniques. For example, mandrels 111 can be a result of self-aligned double patterning or self-aligned quadruple patterning techniques and thus can have sub-resolution half pitches.

Figure 12:
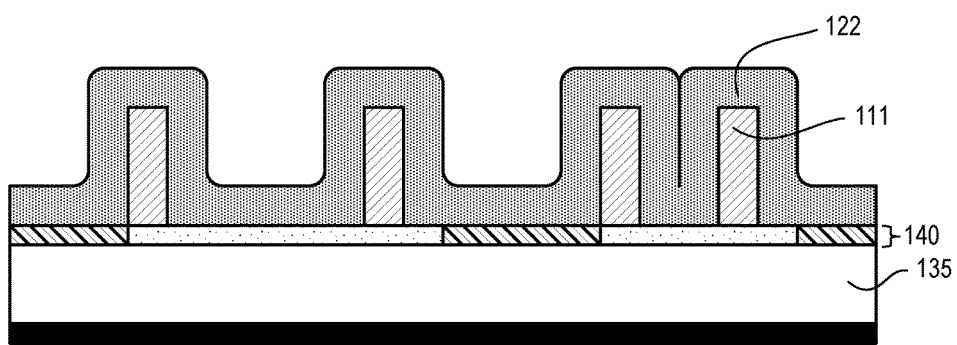
Figure 13:
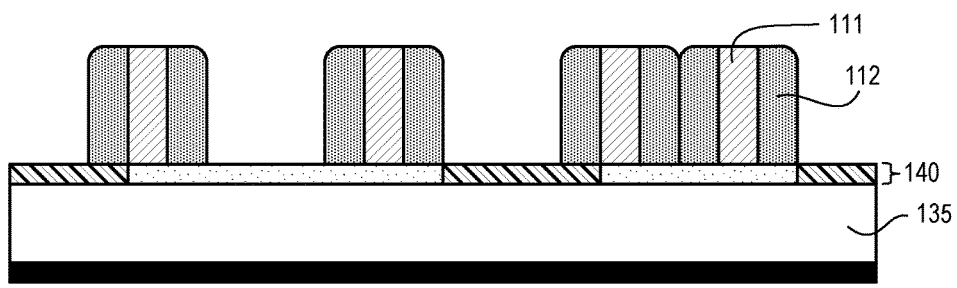

First sidewall spacers 112 are formed on exposed sidewalls of the mandrels 111 as shown in FIG. 13. First sidewall spacers 112 are comprised of a second material. Note that FIG. 13 shows spacers formed on vertical sidewalls of the mandrels 111. Forming first sidewall spacers 112 can include conformally depositing the second material on the substrate. FIG. 12 shows a first conformal film 122 having been deposited on the substrate 105. Such spacer formation is conventionally known. For example, highly conformal deposition techniques, such as atomic layer deposition (ALD), can be selected for depositing spacer material, which approximately uniformly covers mandrels 111 and underlying layer 135. A spacer open etch can then be executed to complete formation of sidewall spacers. Such a spacer open etch is typically a directional etch that removes the second material from a top surface of the mandrels 111 and from the underlying layer 135 in between second material deposited on sidewalls of the mandrels 111 (except where material on sidewalls of mandrels covers the underlying layer 135).

Figure 14:
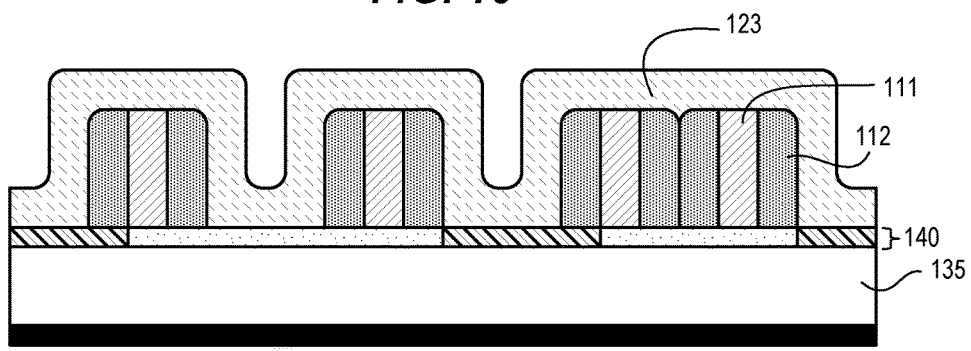
Figure 15:
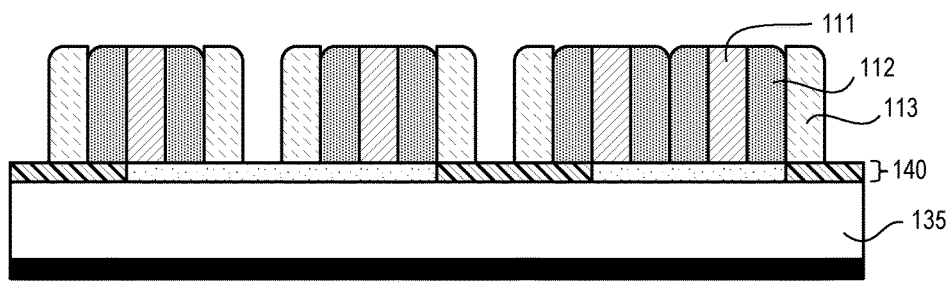

Second sidewall spacers 113 are formed on exposed sidewalls of the first sidewall spacers 112 as shown in FIG. 15. The second sidewall spacers 113 are comprised of a third material. Note that FIG. 15 shows spacers formed on vertical sidewalls of the first sidewall spacers 112. Forming second sidewall spacers 113 can include conformally depositing the third material on the substrate. FIG. 14 shows a second conformal film 123 having been deposited on the substrate 105. Such spacer formation is conventionally known. For example, highly conformal deposition techniques, such as atomic layer deposition (ALD), can be selected for depositing spacer material, which approximately uniformly covers existing structures on the substrate, which can include mandrels 111, first sidewall spacers 112, and patterned hardmask layer 140. A spacer open etch can then be executed to complete formation of sidewall spacers. Such a spacer open etch is typically a directional etch that removes the third material from a top surface of the mandrels 111, the first sidewall spacers 112, and from patterned hardmask layer 140 in between third material deposited on sidewalls of the first sidewall spacers 112 (except where material on vertical sidewalls of structures covers the patterned hardmask layer 140). At least a portion of the first sidewall spacers 112 define open space between each other prior to forming second sidewall spacers. In some locations, mandrel half-pitch can be shortened such that forming first sidewall spacers completely fills space between selected mandrel pairs and thus prevents forming second sidewall spacers in such a location. In other words, varying pitch of the mandrels can cause some merged spacers, either from the first sidewall spacers or the second sidewall spacers. Such a fabrication technique can be beneficial (for example) in forming power rails for integrated circuits.

Figure 16:
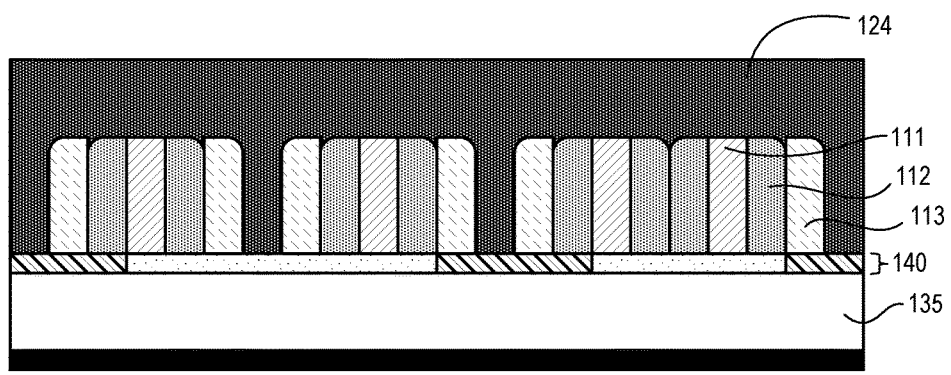
Figure 17:
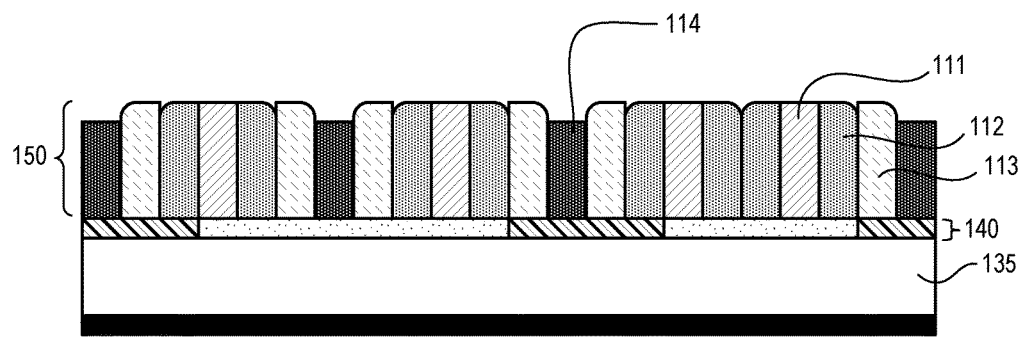

Referring now to FIG. 17, fill structures 114 are then formed on the substrate 105 that fills open spaces defined between exposed sidewalls of second sidewall spacers 113 that face each other (prior to forming the fill structures 114). The fill structures 114 are comprised of a fourth material. Fill structures 114 are formed such that top surfaces of the mandrels 111, the first sidewall spacers 112, the second sidewall spacers 113, and the fill structures 114 are all uncovered. Material selection during formation is such that the first material, the second material, the third material and the fourth material are all chemically different from each other. Forming fill structures 114 can include depositing an overburden material 124 of the fourth material on the substrate. FIG. 16 shows overburden material 124 deposited on substrate 105, which can entirely cover existing structures. Various deposition techniques for depositing the overburden material 124 can be used including spin-on deposition. After deposition, overburden material 124 can be etched back, or otherwise pulled down, until the fourth material is recessed below top surfaces of the second sidewall spacers 113. The fourth material can also be recessed below top surfaces of first sidewall spacers 112 and mandrels 111.

Other embodiments can exclude the fill structures and instead have trenches (un-filled lines) function as one or more lines of the multi-line layer. For example, a patterned hardmask layer is formed as described above. A multi-line layer is formed above the patterned hardmask layer. The multi-line layer includes a region having a pattern of alternating lines of two or more differing materials. In this region, each line has a horizontal thickness, a vertical height, and extends across the patterned hardmask layer, and each line of the pattern of alternating lines is uncovered on a top surface of the multi-line layer and vertically extends to a bottom surface of the multi-line layer. At least two of the two or more differing materials differ chemically from each other by having different etch resistivities relative to each other. The multi-line layer also defines trenches as part of the pattern of alternating lines of two or more differing materials. Thus, defined trenches extend parallel with lines of material and uncover a portion of the patterned hardmask layer.

One example of such a multi-line layer is shown in FIG. 15 as a multi-line layer ready for pattern transfer. Thus, in this particular example embodiment, depositing overburden material and pulling down the overburden material is omitted. This can be beneficial in some applications because certain fill materials can be more difficult than others to fill trenches and pull-down. A given design can account for there being a pattern of trenches remaining in the multi-line layer and use these openings as the first pattern-transfer location. Accordingly, a combined pattern can be transferred into the underlying layer. The combined pattern is then defined by hardmask material and materials of the multi-line layer covering the patterned hardmask layer. Thus, with one line having no material, the initial pattern transfer can be executed without first having to selectively remove one of the lines. Another example can be seen in FIG. 3C. The pattern in FIG. 3C is A-B-C-B-A-B-C-B, which then repeats. In this multi-line layer, forming material C can be omitted and thus where material C is indicated there would be a trench instead. This configuration can be created by forming material A as a mandrel, deposited material B conformally, and then executing a spacer open etch on material B to yield sidewall spacers on material A and with material B removed from the patterned hardmask layer.

Accordingly, a multi-line layer 150 is formed on the patterned hardmask layer 140. Any line or combination of lines from multi-line layer 150 can be selectively removed, and then a combined pattern of remaining lines and patterned hardmask layer 140 can be transferred into underlying layer 135.

As can be appreciated, a matrix of selectable materials and material combinations can be created to create features at desired locations and lengths that are below resolution capabilities of conventional photolithography systems. Note that etched features themselves can be transferred into memorization layers and/or target layers, and can also be used to reverse patterns. Accordingly, two, three, four, five or more different materials can be accessed for selective etching. Self-alignment can be selected at various places on a substrate using an underlying patterned hardmask and the differential etch selectivities of the different materials. In other words, with different materials of known dimensions, a designer can select where to execute an etch and have that etch be self-aligned at sub-resolution dimensions. For example, if a given contact pattern from a photoresist material is relatively large and spans multiple materials, a contact will only be etched at one of the materials within that particular contact pattern opening.

Thus, techniques herein can be used to provide a pedestalized color scheme, that is, materials with differential etch selectivities. Moreover, the pattern of alternating lines of material can be fabricated to have different pitches depending on design interests. Conventionally, it is very difficult to cut on pitch. Conventional photolithography systems can make cuts of about 42 nanometers. With techniques herein, however, a contact can be placed at will anywhere on a given substrate. This patterning technique also enables pitch splitting across colors. In some regions there can be a full half pitch between materials, while in other regions there are relatively large amounts of self-alignment, such as between mandrels. Moreover, by selecting two or more of available materials in which two of the materials are adjacent to each other, off-pitch or mixed-size etches can be executed. Thus, various pitch multiples can be made as a cut or a block with techniques herein.

Conventional patterning techniques involve forming a hardmask on top of a given substrate. Such formation requires first planarizing the substrate, which can involve having fill material deposited. This fill material can have significantly different heights above a given underlying feature. For example, fill material in some locations can be double, triple, quadruple or more the height of fill material in other locations. Because of complex topography, creating a suitable planarizing fill by itself is challenging. Additionally, etching through fill materials of such differential height—with a hardmask on top—creates an enormous etching challenge requiring etch resistivity ratios that are exceedingly difficult to meet, if even possible. Techniques herein, however, provide a relatively thin, unobtrusive block mask or cut mask first, and then a multi-material pattern formed on top can be used to selectively access portions of the block mask or cut mask.

With such a structure or pattern formed, many options are available for pattern transfer. For example, one option is to add or subtract a given hardmask pattern from a transfer. By way of a non-limiting example, adding a block can result in an "H" shape because a block was added to two lines. Subtracting a block can provide a self-aligned cut of a given block mask. Any clear field or dark field hardmasks can be added to, or subtracted from, any of multiple overlying materials (after selective etching) to form a combined etch mask. In other words, any 2-dimensional hardmask pattern or layer can be formed, and then any 2-dimensional multi-material layer can be formed on top of the hardmask layer. Even though the hardmask layer might be initially formed (registered) by lithographic patterning, and even though the multi-material layer might also be initially registered lithographically, a cross point of the two layers provides sub-resolution patterning because the combination of the two layers and ability to selectively etch one or more of multiple uncovered materials, augments lithographic registration to provide many precise etch transfer operations and options including self-aligned gate and self-aligned block etches.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
    forming a patterned hardmask layer on a substrate, the patterned hardmask layer including hardmask material that masks a portion of an underlying layer, the patterned hardmask layer including a fill material that fills a remaining portion of the patterned hardmask layer, the fill material having a different etch resistivity relative to the hardmask material;
    forming a multi-line layer above the patterned hardtnask layer, the multi-line layer including a region having a pattern of alternating lines of two or more differing materials, wherein each line has a horizontal thickness, a vertical height, and extends across the patterned hardmask layer, wherein each line of the pattern of alternating lines is uncovered on a top surface of the layer and vertically extends to a bottom surface of the multi-line layer, wherein at least two of the two or more differing materials differ chemically from each other by having different etch resistivities relative to each other, said forming a multi-line layer comprising forming lines of a first material of the differing materials, and forming adjacent lines by depositing a second material of the differing materials on said lines respectively; and
    selectively removing at least one of the two or more differing materials resulting in a portion of the patterned hardmask layer being uncovered.

2. The method of claim 1, wherein the two or more differing materials include three or more differing materials, wherein selectively removing at least one of the two or more differing materials includes selectively removing two of the three or more differing materials resulting in corresponding portions of the patterned hardmask layer being uncovered.

3. The method of claim 1, wherein the two or more differing materials include four or more differing materials, wherein selectively removing at least one of the two or more differing materials includes selectively removing two of the four or more differing materials resulting in corresponding portions of the patterned hardmask layer being uncovered.

4. The method of claim 1, wherein the pattern of alternating lines of two or more differing materials includes a repeating sequence of A-B-A-B in which material A and material B have different etch resistivities relative to each other.

5. The method of claim 1, wherein the pattern of alternating lines of two or more differing materials includes a repeating sequence of A-B-C-B-A-B-C-B in which material A and material B have different etch resistivities relative to each other.

6. The method of claim 5, wherein material C has a different etch resistivity relative to material A and material B.

7. The method of claim 1, wherein the pattern of alternating lines of two or more differing materials includes a repeating sequence of A-B-C-D-C-B-A-B-C-D-C-B,
wherein at least two of materials A, B, C and D) have different etch resistivities relative to each other.

8. The method of claim 1, wherein forming the patterned hardmask includes forming a relief pattern of hardmask material and planarizing the hardtnask layer with the filler material.

9. The method of claim 1, wherein the hardmask material includes a metal.

10. The method of claim 1, wherein forming the multi-line layer includes:
providing the substrate having mandrels positioned on the hardmask layer, the mandrels comprised of said first material;
forming first sidewall spacers on exposed sidewalls of the mandrels, the first sidewall spacers comprised of said second material;
forming second sidewall spacers on exposed sidewalls of the first sidewall spacers, the second sidewall spacers comprised of a third material; and
forming fill structures that fill open spaces defined between exposed sidewalls of the second sidewall spacers that face each other, the fill strictures comprised of a fourth material,
wherein top surfaces of the mandrels, the first sidewall spacers, the second sidewall spacers, and the fill structures are all uncovered, and
wherein at least two materials of the first material, the second material, the third material and the fourth material are chemically different from each other.

11. The method of claim 1, wherein forming the multi-line layer includes:
providing a substrate having mandrels positioned on the hardmask layer, the mandrels comprised of said first material;
forming first sidewall spacers on exposed sidewalls of mandrels, the first sidewall spacers comprised of said second material; and
forming fill structures that fill open spaces defined between exposed sidewalls of first sidewall spacers that face each other, the fill structures comprised of a fourth material, wherein top surfaces of the mandrels, the first sidewall spacers, and the fill structures are all uncovered, and wherein at least two materials of the first material, the second material, and the fourth material are chemically different from each other.

12. The method of claim 1, further comprising transferring a combined pattern into the underlying , the combined pattern being defined by hardmask material and remaining materials of the multi-line layer.

13. The method of claim 12, wherein the underlying layer is a memorization layer that receives the combined pattern during transfer of the combined pattern.

14. The method of claim 13, wherein the memorization layer is comprised of material having a different etch resistivity relative to materials in the multi-line layer.

15. The method of claim 12, wherein transferring the combined pattern into the underlying layer includes cutting one or more buried structures within the underlying layer.

16. The method of claim 1, wherein a pitch of a given line of material in the two or more lines is less than an optical resolution of a given photolithography system.

17. The method of claim 1, wherein lines of respective material have a half-pitch spacing of less than 16 nanometers.

18. A method of patterning a substrate the method comprising:
forming a patterned hardmask layer on a substrate, the patterned hardmask layer including hardmask material that masks a portion of an underlying layer, the patterned hardmask layer including a fill material that fills a remaining portion of the patterned hardmask layer, the fill material having a different etch resistivity relative to the hardmask material;
forming a multi-line layer above the patterned hardmask layer, the multi-line layer including a region having a pattern of alternating lines of two or more differing materials, wherein each line has a horizontal thickness, a vertical height, and extends across the patterned hardmask layer, wherein each line of the pattern of alternating lines is uncovered on a top surface of the multi-line layer and vertically extends to a bottom surface of the multi-line layer, wherein at least two of the two or more differing materials differ chemically from each other by having different etch resistivities relative to each other, said forming a multi-line layer comprising forming lines of a first material of said differing materials, and forming adjacent lines by depositing a second material of the differing materials on said lines respectively; and
selectively removing at least one of the two or more differing materials resulting in a portion of the patterned hardmask layer being uncovered, wherein forming the multi-line layer includes:
providing the substrate having mandrels positioned on the hardmask layer, the mandrels comprised of a first material; and
forming fill structures that fill open spaces defined between exposed sidewalls of the mandrels, the fill structures comprised of a fourth material, wherein top surfaces of the mandrels and the fill structures are all uncovered, and wherein the first material and the fourth material are chemically different from each other.

19. A method of patterning a substrate, the method comprising:
forming a patterned hardmask layer on a substrate, the patterned hardmask layer including hardmask material that masks a portion of an underlying layer, the patterned hardmask layer including a fill material that fills a remaining portion of the patterned hardmask layer, the fill material having a different etch resistivity relative to the hardmask material;
forming a multi-line layer above the patterned hardmask layer, the multi-line layer including a region having a pattern of alternating lines of two or more differing materials, wherein each line has a horizontal thickness, a vertical height, and extends across the patterned hardmask layer, wherein each line of the pattern of alternating lines is uncovered on a top surface of the multi-line layer and vertically extends to a bottom surface of the multi-line layer, wherein at least two of the two or more differing materials differ chemically from each other by having different etch resistivities relative to each other, said forming a multi-line layer comprising forming lines of a first material of the differing materials, and forming adjacent lines by depositing a second material of the differing materials on said lines respectively and the multi-line layer also defines trenches as part of the pattern of alternating lines of two or more differing materials, wherein defined trenches extend parallel with lines of material and uncover a portion of the patterned hardmask layer; and transferring a combined pattern into the underlying layer, the combined pattern being defined by hardmask material and materials of the multi-line layer covering the patterned hardmask layer.

\* \* \* \* \*

UNITED STATES PATENT AND TRADEMARK OFFICE
CERTIFICATE OF CORRECTION

PATENT NO. : 10,103,032 B2
APPLICATION NO. : 15/271876
DATED : October 16, 2018
INVENTOR(S) : Anton J. deVilliers Page 1 of 1

It is certified that error appears in the above-identified patent and that said Letters Patent is hereby corrected as shown below:

In the Claims

In Column 12, Line 36, Claim 1, delete "hardtnask" and insert --hardmask--;

In Column 12, Line 43, Claim 1, delete "layer" and insert --multi-line layer--;

In Column 13, Line 16, Claim 7, delete "D)" and insert --D--;

In Column 13, Line 20, Claim 8, delete "hardtnask" and insert --hardmask--;

In Column 13, Line 37, Claim 10, delete "strictures" and insert --structures--;

In Column 13, Line 62, Claim 12, delete "underlying ," and insert --underlying layer,--; and In Column 14, Line 13, Claim 18, delete "substrate" and insert --substrate,--.

Signed and Sealed this
Twenty-first Day of April, 2020

Andrei Iancu
*Director of the United States Patent and Trademark Office*